US005117228A

United States Patent [19]

Fuchigami et al.

[11] Patent Number: 5,117,228

[45] Date of Patent: May 26, 1992

[54] SYSTEM FOR CODING AND DECODING AN ORTHOGONALLY TRANSFORMED AUDIO SIGNAL

[75] Inventors: Tokuhiko Fuchigami, Yokohama; Masaya Konishi, Yokosuka; Sadahiro Yasura, Ota; Yasuhiro Yamada, Yokosuka, all of Japan

[73] Assignee: Victor Company of Japan, Ltd., Yokohama, Japan

[21] Appl. No.: 597,706

[22] Filed: Oct. 17, 1990

[30] Foreign Application Priority Data

Oct. 18, 1989 [JP] Japan .................................. 1-271010

[51] Int. Cl.[5] .......................... H03M 1/18; G10L 3/00

[52] U.S. Cl. ...................................... 341/200; 381/46; 341/139

[58] Field of Search .......................... 341/200, 76, 139; 381/31, 46

[56] References Cited

U.S. PATENT DOCUMENTS 4,894,713 1/1990 Delogne et al. .................... 358/135

4,918,734 4/1990 Muramatsu et al. .................. 381/46

*Primary Examiner*—Sharon D. Logan

*Attorney, Agent, or Firm*—Fleit, Jacobson, Cohn, Price, Holman & Stern

[57] ABSTRACT

A system for coding and decoding an audio signal by using an orthogonal and inverse orthogonal transformation of a block unit, includes a coding unit having a circuit for obtaining a power level of the audio signal of a segment unit having a predetermined time interval shorter than the block unit, a circuit for generating a gain control signal from the power level, a circuit for performing a predetermined adaptive gain control responsive to the gain control signal to generate and output the adaptive gain control signal to a decoding unit, thereby performing a pre-treatment, and a coding portion for coding the adaptive gain control signal by using the orthogonal transformation to generate and output a coded signal; and the decoding unit having a decoding portion for decoding the coded signal, dequantizing and inversely and orthogonally transforming a decoded audio signal, and a circuit for performing an inverse gain control for the decoded audio signal responsive to the adaptive gain control signal from the adaptive gain control circuit to reproduce and output an audio signal, thereby performing post-treatment.

8 Claims, 6 Drawing Sheets

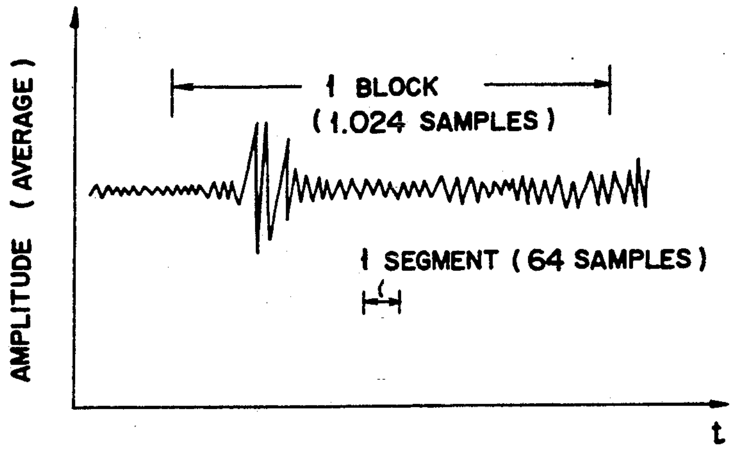
FIG. 2
FIG. 3(a)
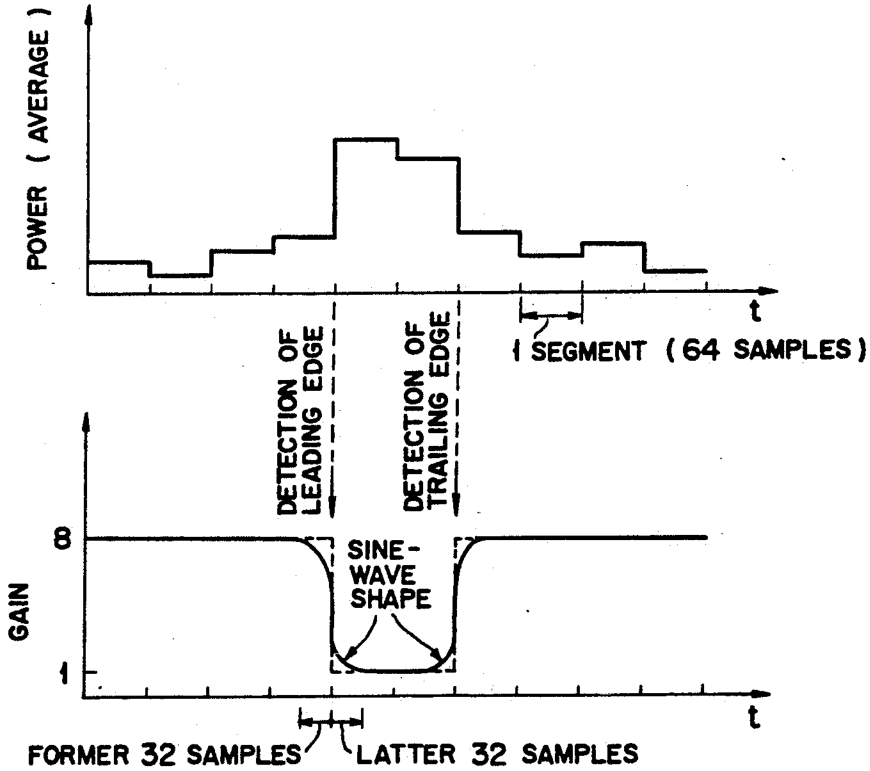
FIG. 3(b)

SYSTEM FOR CODING AND DECODING AN ORTHOGONALLY TRANSFORMED AUDIO SIGNAL

BACKGROUND OF THE INVENTION

In many digital coding and decoding systems for audio signals, a non-uniform quantization, for example, a logarithmic quantization, is widely used to compress coded data rate.

If an orthogonal transformation, for example, a discrete cosine transformation (DCT), a discrete Fourier transformation (DFT) or the like, is applied to the audio signal, it will be expected that the coded data rate is greately compressed. The basic block diagrams of a system like this are shown in FIGS. 8A and 8B.

As shown in FIG. 8A, a coding portion 20 comprises a window circuit 1 including a frame buffer for receiving an input audio signal, an orthogonal transform circuit 2 such as a DCT, DFT or the like, quantization circuit 3, and a coder circuit 4 for outputting a coded signal.

In contrast, as shown in FIG. 8B, a decoding portion 30 comprises a decoder circuit 5, a dequantization circuit 6, an inverse orthogonal transformation circuit 7 using an inverse discrete fourier transformation (IDFT) or an inverse discrete cosine tranformation (IDCT), and a window circuit 8 including an adder. The coded signal is received by the decoding portion 30 so as to be decoded and outputted as an output audio signal.

In FIG. 8A, an audio signal sampled by a sampling signal is inputted to the window circuit 1 in which a predetermined number of samples is cut out from the input signal as a block for orthogonal transformation. Usually, each block contains 256 to 2048 samples and corresponds to a period of 11 to 43 msec at a sampling frequency of 48 kHz.

In FIGS. 9A and 9B, the wave forms of sound signals generated by musical instruments are shown. As shown in the drawings, the sound of these musical instruments contains steep transients in which there is a large variation in amplitude level, and the period of each transient is sufficiently short relative to the period of the block. Therefore, there coexist high and low level portions in the block. It should be noted that if the maximum level of the signal being processed is high, the step size of quantization will be wide. The signal so seperated in blocks is transformed in the orthogonal transformation circuit 2, then quantized in the quantization circuit 3.

When the signal is processed by the non-uniform quantization in which the number of quantization steps (bits) is lessened for data rate compression and the step size is necessarily widened, quantization noise occurs at the low level portions. FIG. 10 shows the distributions of the quantization noise in the time axis of the signal. As is apparent from the figure, the quantization noise by quantizing at the high level portions of the original signal, influences the entire block on the time axis, and the noise becomes over a power in a lesser level of .the original signal. As a result, the quantization noise is audible as a noise incidental to the transient of the signal.

As described above, a conventional system has a problem in that the quantization noise is easy to detect with the non-uniform quantization when an audio signal, especially one having extremely steep transients, is coded.

SUMMARY OF THE INVENTION

An object of the present invention is to provide a system for coding and decoding an audio signal, which is capable of coding the audio signal having an extremely steep transient in high quality in the manner that the quantization noise occurring with the transient of the audio signal is supressed when the signal is coded by orthogonal transformation.

In order to accomplish the above object, a system for coding and decoding an audio signal by using an orthogonal and inverse orthogonal transformation of a predetermined block unit, characterized in that the system comprises a coding unit having segment power detection means for obtaining a power level of the audio signal of a segment unit having a shorter duration than the block, means for generating a gain control signal on the basis of the power level, means for pre-treating the signal so as to perform predetermined adaptive gain control and outputting the signal so pre-treated to a coding portion and a decoding unit, and the coding portion for coding the pre-treated signal to a signal encoder so as to output the coded signal to the decoding unit, and decoding unit having a decoding portion for inverse-orthogonally transforming and decoding the coded signal output from the coding unit so as to output a decoded signal, and post-treatment means for performing an inverse gain control responding to the decoded signal and the gain controlled signal output from the post-treatment means so as to output an audio signal. The decoding portion comprises decoder means for decoding the coded signal, dequantization means for dequantizing an output of the decoder means, inverse orthogonal transformation means for inversely and orthogonally transforming an output of the dequantization means, and window means for processing a block length of an output of the transformation means.

By the above system, a gain to the input audio signal is adaptively controlled corresponding to .the power level of the input audio signal so as to relatively decrease a noise level corresponding to the power level of the audio signal.

As above-mentioned in detail, the present invention has an effect that even in the case of an audio signal of the sound such as a castanet or triangle having an extremely steep or precipitous transient, quantization noise occurring with the transient in utilizing the orthogonal transformation coding is suppressed, thereby achieving high-quality coding.

BRIEF DESCRIPTION OF THE DRAWINGS

In the accompanying drawings:

FIG. 2 is an explanation view showing a unit of a segment according to the embodiment;

FIGS. 3(*a*) and 3(*b*) are characteristic diagrams respectively showing controlled gain curves by a segment power;

FIG. 8 is a basic block diagram showing a conventional system for coding and decoding an audio signal using DCT, DFT or the like;

DETAILED DESCRIPTION OF THE PREFERRED EMBODIMENTS

There will now be described in detail a system for coding and decoding an orthogonal transformed audio signal according to a preferred embodiment of the present invention with reference to FIGS. 1 to 7.

An outline of a coding/decoding system

The present invention is characterized in that, at coding, there is set a segment having a length being sufficiently shorter than a block length for an orthogonal transformation, an extremely precipitous transient (an momentary changing point) is detected by calculating a signal power level in the segment, thereby performing an adaptive gain control in which a gain increases in the low level portion and decreases in the high level portion. Furthermore, at decoding, a coded audio signal is first processed by inverse orthogonal transformation, and there is added an envelope processing that an inverse gain control suppresses quantization noise.

Figure 7:
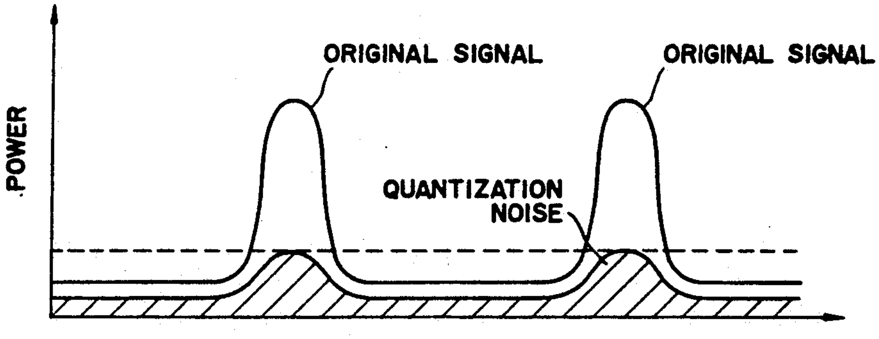
FIG. 7 is a characteristic diagram showing a suppression state of a quantization noise as an effect of the system according to the present invention.
Figure 8A:
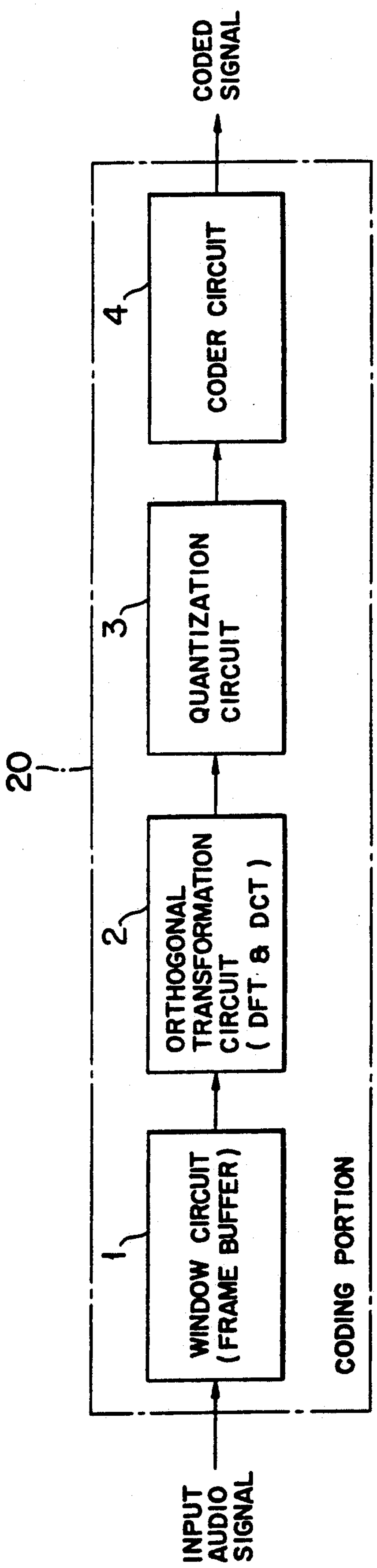
FIG. 8(a) PRIOR ART
Figure 8B:
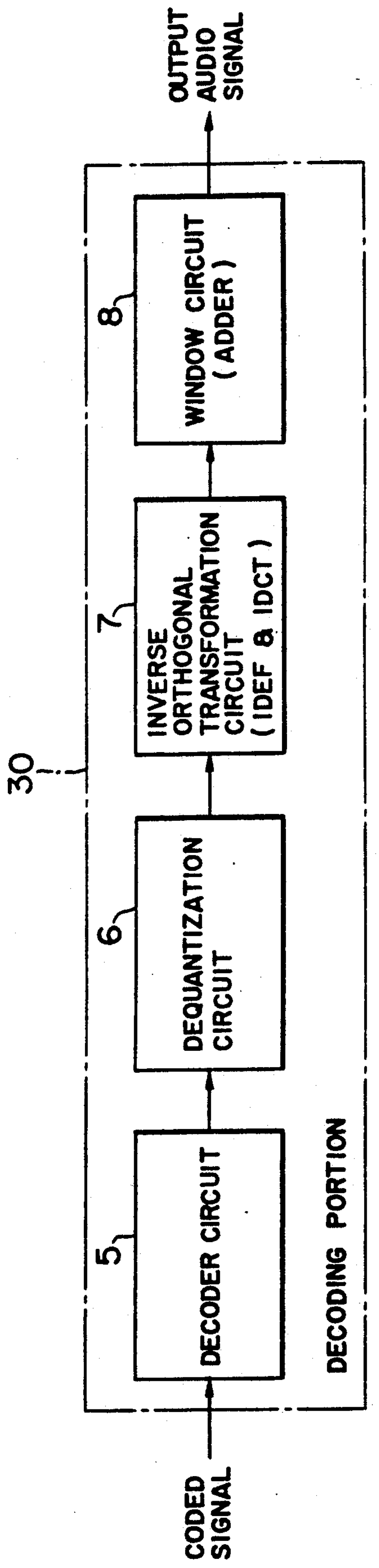
FIG. 8(b) PRIOR ART
Figure 9A:
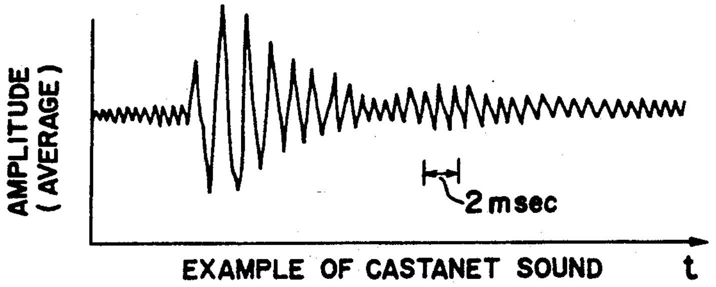
FIG. 9(a) PRIOR ART
FIGS. 9(*a*) and 9(*b*) are characteristic diagrams showing signal waveforms of a castanet sound and a triangle sound as examples of having an extremely steep transient, respectively.
Figure 9B:
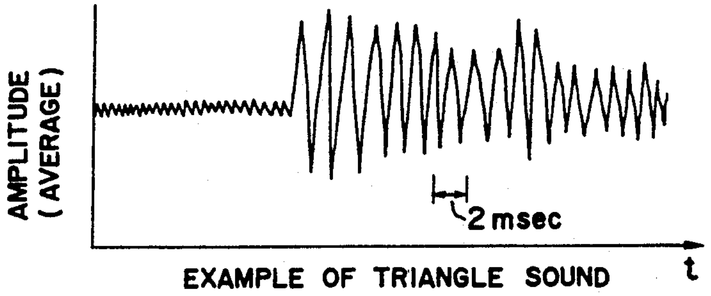
FIG. 9(b) PRIOR ART
Figure 10A:
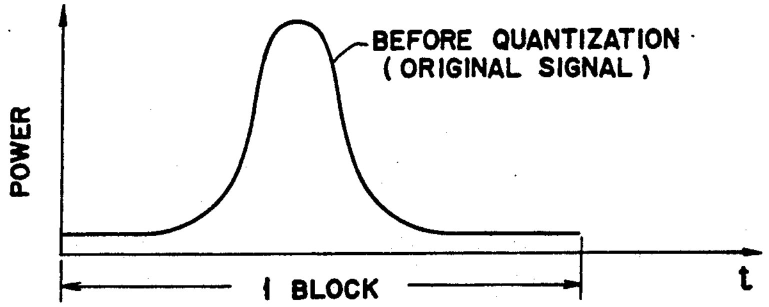
FIG. 10(a) PRIOR ART
FIGS. 10(*a*) and 10(*b*) are explanation views respectively showing conditions that a quantization noise stretches a whole block in the time axis by non-linear quantization in the conventional system.
Figure 10B:
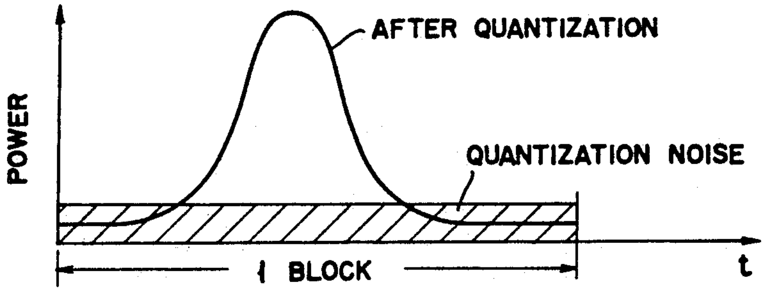
FIG. 10(b) PRIOR ART

By adding the envelope processing, the quantization noise of the low level portion of an original signal after decoding, as shown in FIG. 7, relatively decreases against a signal level. Accordingly, the quantization noise is reduced and is inaudible at the signal transient.

Figure 6A:
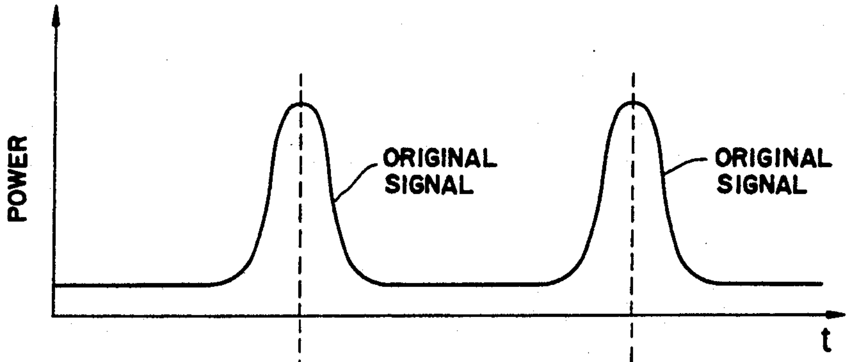
FIGS. 6(*a*) and 6(*b*) are characteristic diagrams respectively showing a conception of adaptive gain control.
Figure 6B:
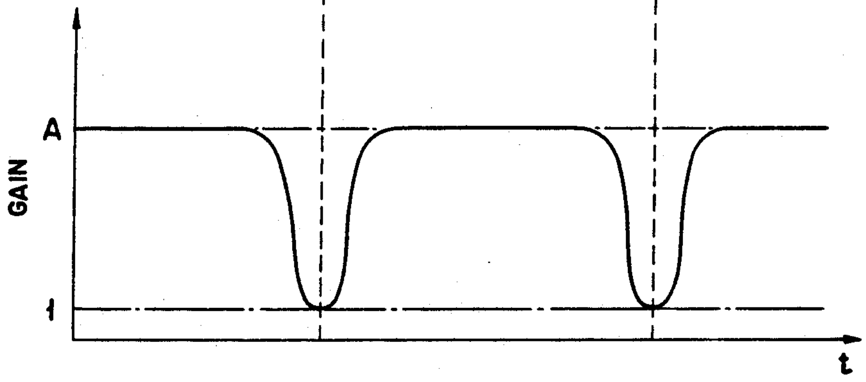

The relation between the power level and the gain is shown in FIGS. 6(*a*) and 6(*b*). As shown in the FIGS., a signal gain decreases in a high power level and increases in a low power level.

As shown in FIG. 2, the segment length is set to 64 samples (about 1.3 msec, $f_s$=48kHz) in consideration of an auditory resolution of about 1 msec. In each segment, and total power of 64 samples is used as the segment power, and the transient is detected on the basis thereof.

Configuration of Coding Unit and Decoding Unit

As shown in FIG. IA, a coding unit comprises a segment power detection circuit 10 for detecting a segment power of 64 samples from an input audio signal, a transient detection circuit 11 for detecting a transient of the audio signal an adaptive gain control circuit 12 for controlling the gain of the signal adaptively and outputting additional information for expressing the controlling state to a decoding unit, and the coding portion 20 having the same configuration as the conventional system described before. The coding portion 20 comprises the window circuit 1 including a frame buffer, the orthogonal transformation circuit 2 such as DCT or DFT, the quantization circuit 3, and the coder circuit 4. The circuits 10 to 12 form a pre-treatment portion 15.

The segment power detection circuit 10 calculates a segment power by summing up each power of 64 samples of the input audio signal and outputs the result to the transient detection circuit 11 of the following stage. The transient detection circuit 11 generates a gain control signal by comparing the segment power (level) with a predetermined threshold level and controls the adaptive gain control circuit 12 of the next stage. The input audio signal has gain controlled by the adaptive gain control circuit 12 and coded as a coded signal by the coding portion 20 after the following stage. The coded signal is transmitted with the gain control signal (the additional information) to the decoding unit.

Figure 1A:
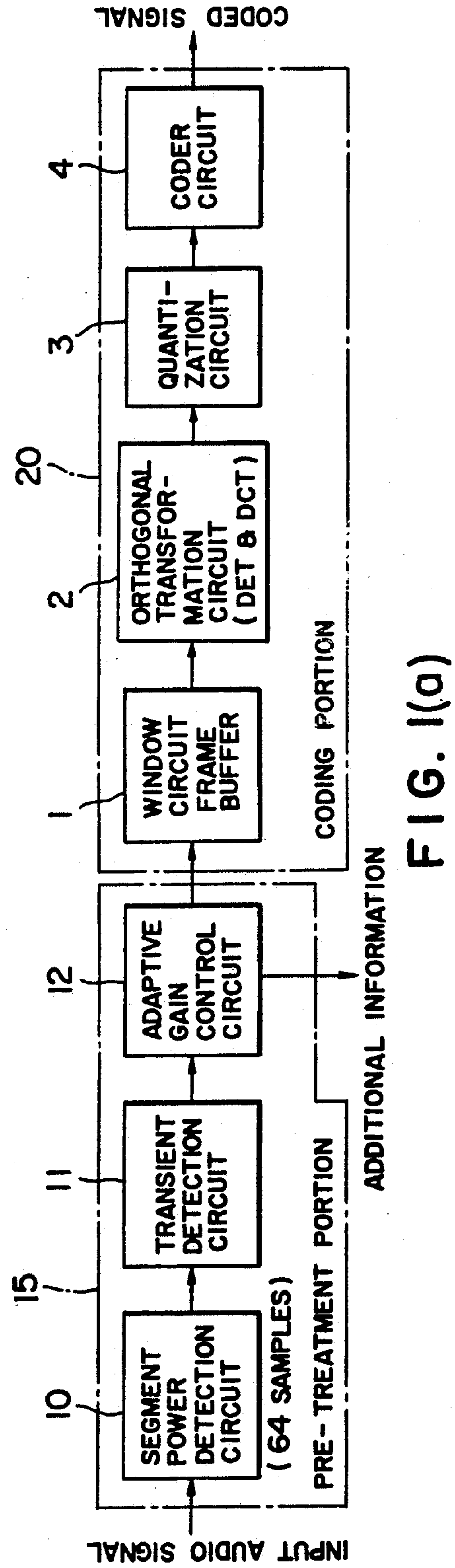
FIG. 1 is a basic block diagram showing a system for coding/decoding an orthogonally transformed audio signal according to an embodiment of the present invention.
Figure 1B:
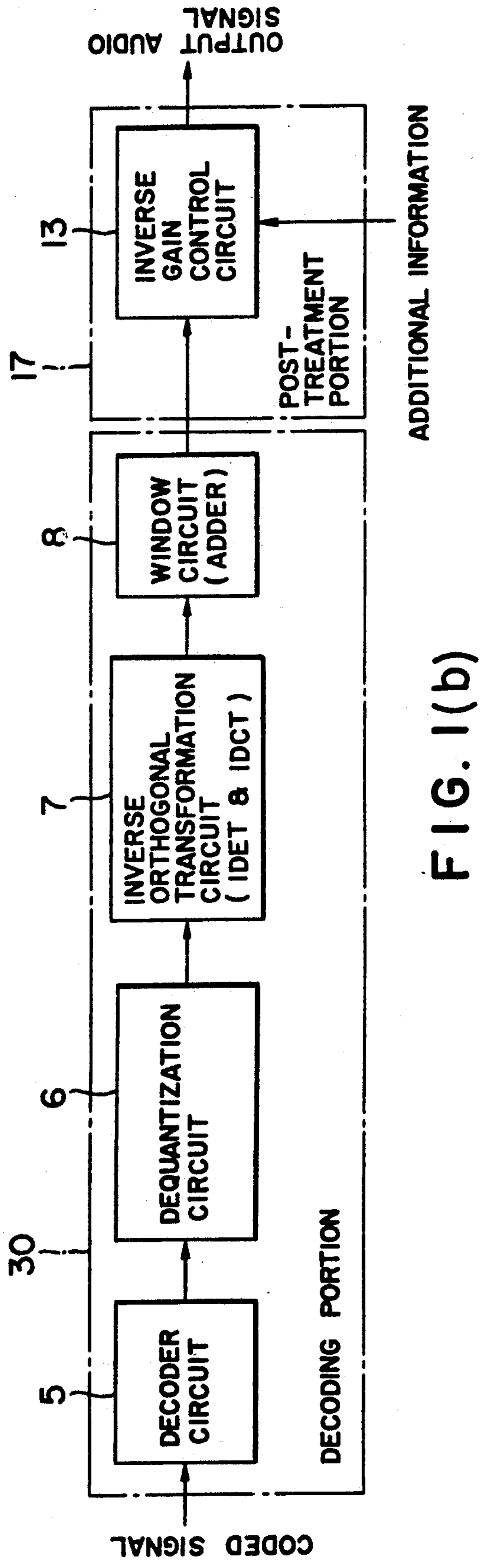

On the contrary, the decoding unit comprises, as shown in FIG. 1B, the decoding portion 30 having the same configuration as the conventional system, and an inverse gain control circuit 13 as a post-treatment portion 17. The decoding portion 30 comprises the decoder circuit 5, the dequantization circuit 6, the inverse orthogonal transformation circuit 7 such as the IDCT or IDFT, and the window circuit 8 including the adder.

There is provided the inverse gain control circuit 13 for a post-treatment which connected after the decoding portion 30. The control circuit 13 inversely controls a gain of an audio signal decoded by the decoding portion 30 responding to the gain control signal (the additional information), thereby recovering the original level so as to output it.

Detecting Process by Transient Detection Circuit

Next, there is described a concrete configuration and function of the transient detection circuit 11.

A transient detection method includes an absolute threshold system and a preceeding and succeeding segment comparison (relative comparison) system.

(i) The Absolute Threshold System

An example of the transient detection and adaptive gain control in this system is shown in FIGS. 3(*a*) and 3(*b*), where FIG. 3(*a*) shows the variation of the segment power and FIG. (*b*) shows a gain control responsive thereto. In the FIG., there are set two gains such as "1" and "8", in which the gain "8"is an initial level.

When the segment power becomes over a predetermined level as a leading edge, the transient of the signal is detected and the gain decreases to the gain "1" corresponding to the transient level. When the segment power becomes under a predetermined level as a trailing level, the gain returns to the gain "8" corresponding thereof. A repeat of both operations means an adaptive gain control. A gain set value is transmitted by the additional information as the gain control signal.

Here, such a change of gain is equal to a multiplication of the window function on the time axis and influences to the frequency axis. If the gain change is performed precipitously, an undesirable spectrum spreading occurs on the frequency axis. In order to reduce the influence, the gain change is controlled gradually along a smooth non-linear line such as a sine curve so as to complete the change within 32 samples preceeding and succeeding a segment boundary where a level change occurs (refer to the solid line and the dotted line shown in FIG. 3(b)).

Figure 4A:
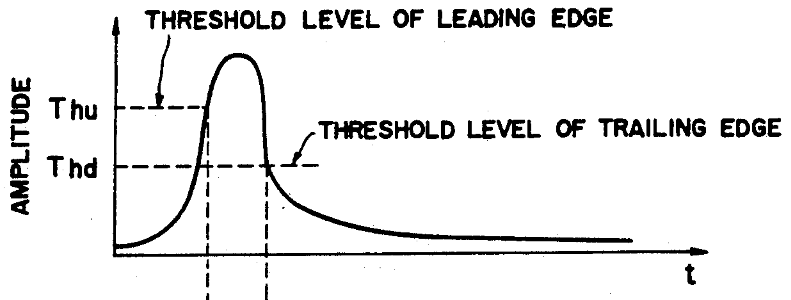
FIGS. 4(*a*) and 4(*b*) are characteristic diagrams respectively showing another modified embodiment of the gain control.
Figure 4B:
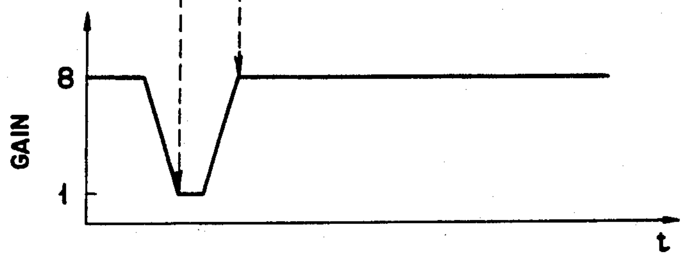

It is necessary to change a set value of the leading edge and trailing edge levels corresponding to the input audio signal. The trailing edge of the transient is generally gentler than the leading edge of the transient. Accordingly, as shown in FIGS. 4(*a*) and 4(*b*), a threshold level at the trailing edge is set in lower level in comparison with the leading edge and a preferable result in which the time interval having the gain "1" is lengthened, is obtained.

(ii) Comparison to Preceeding and Succeeding Segment System (Relative Comparison System)

Though the above system is suitable to be simplified because the detection of the transient is performed by comparison with a fixed level, the gain changes unnecessarily and frequently depending upon the signal.

In the relative comparison system, two segment powers are usually observed, so that when a relative value is over a predetermined level, the leading edge is detected, and when the relative value is under the predetermined level, the trailing edge is detected. Here, the relative value means, for example, a proportion, a difference, an absolute value of difference, and the like, of both the segment powers. Portions without the transient detection are processed by the system of the above item (i). In this system, it is unnecessary to change the threshold level even when the types of signals are different.

(iii) Combined System

Furthermore, the present invention may combine the above systems of the items (i) and (ii). For example, when there is an amplitude difference of 20 dB between adjacent segments and the amplitude is over the predetermined level, the transient is detected so as to control the gain, namely, the gain decreases. When the amplitude is under the predetermined level in absolute value, the gain is recovered, namely, the gain may increase. Also, the gain control may be recovered at the block boundary.

(ix) A Plurality of Stage Type System

Figure 5A:
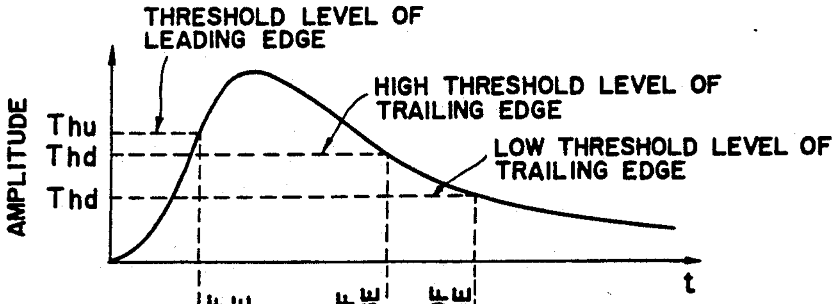
FIGS. 5(*a*) and 5(*b*) are characteristic diagrams respectively showing still another modified embodiment of the gain control.
Figure 5B:
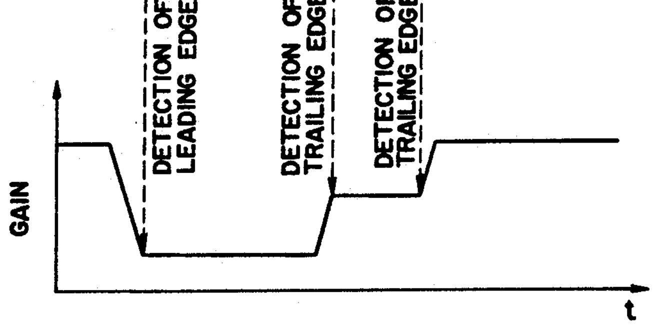

The present invention may return the gain control or the gain may be increased over a plurality of stages. As shown in FIGS. 5(*a*) and 5(*b*), at the trailing edge, the gain is controlled in two stages and recovered slowly, thereby preventing the quantization noise from precipitous change in comparison with FIGS. 4(*a*) and 4(*b*).

What is claimed is:

1. A system for coding and decoding an audio signal, said system having a coding apparatus for coding the audio signal by an orthogonal transformation of a block unit, said coding apparatus comprising:

pre-treatment means for obtaining a power level of a segment unit of the audio signal having a time interval shorter than the time interval of said block unit, and comprising adaptive gain control means for performing a predetermined adaptive gain control corresponding to said power level, so as to generate a gain control signal indicative of said predetermined adaptive gain control and a pre-treated audio signal by a result obtained from a comparison between a threshold value and said power level of said segment unit, and wherein said adaptive gain control means sets said threshold value at a trailing edge of said input audio signal to a predetermined value lower than one at a leading edge of said input audio signal; and coding means including means for receiving said pre-treated audio signal, means for orthogonally transforming said pre-treated audio signal to generate an orthogonally transformed signal, means for quantizing said orthogonally transformed signal, means for quantizing said orthogonally transformed signal to generate a quantization signal, and means for coding said quantization signal to output a coded signal.

2. The system according to claim 1, wherein said adaptive gain control means performs said predetermined adaptive gain control corresponding to a relative value of said power level, which is relative to power levels of segment units proceeding and succeeding a segment unit.

3. A system for coding and decoding an audio signal, said system having a coding apparatus for coding the audio signal by an orthogonal transformation of a block unit, said coding apparatus comprising:

pre-treatment means for obtaining a power level of a segment unit of the audio signal having a time interval shorter than the time interval of said block unit, and comprising adaptive gain control means for performing a predetermined adaptive gain control corresponding to said power level, so as to generate a gain control signal indicative of said predetermined adaptive gain control and a pre-treated audio signal, wherein said adaptive gain control means performs said predetermined adaptive gain control non-linearly at a segment boundary; and coding means including means for receiving said pre-treated audio signal, means for orthogonally transforming said pre-treated audio signal to generate an orthogonally transformed signal, means for quantizing said orthogonally transformed signal to generate a quantization signal, and means for coding said quantization signal to output a coded signal.

4. A system for coding and decoding an audio signal, said system having a coding apparatus for coding the audio signal by an orthogonal transformation of a block unit, said coding apparatus comprising:

pre-treatment means for obtaining a power level of a segment unit of the audio signal having a time interval shorter than the time interval of said block unit, and comprising adaptive gain control means for performing a predetermined adaptive gain control corresponding to said power level, so as to generate a gain control signal indicative of said predetermined adaptive gain control and a pre-treated audio signal by a result obtained from a comparison between a threshold value and said power level of said segment unit, and wherein said adaptive gain control means sets a plurality of threshold values at a trailing edge of said audio signal; and coding means including means for receiving said pre-treated audio signal, means for orthogonally transforming said pre-treated audio signal to generate an orthogonally transformed signal, means for quantizing said orthogonally transformed signal to generate a quantization signal, and means for coding said quantization signal to output a coded signal.

5. The system according to claim 4, wherein said adaptive gain control means performs said predetermined adaptive gain control corresponding to a relative value of said power level, which is relative to power levels of segment units preceding and succeeding a segment unit.

6. The system of claim 1, further comprising a decoding apparatus, said decoding apparatus comprising:

means for decoding said coded signal into a decoded audio signal according to an inverse orthogonal transformation; and means responsive to said gain control signal for post-treating said decoded audio signal inversely with respect to the predetermined adaptive gain control.

7. The system of claim 3, further comprising a decoding apparatus, said decoding apparatus comprising:

means for decoding said coded signal into a decoded audio signal according to an inverse orthogonal transformation; and means responsive to said gain control signal for post-treating said decoded audio signal inversely with respect to the predetermined adaptive gain control.

8. The system of claim 4, further comprising a decoding apparatus, said decoding apparatus comprising:

means for decoding said coded signal into a decoded audio signal according to an inverse orthogonal transformation; and means responsive to said gain control signal for post-treating said decoded audio signal inversely with respect to the predetermined adaptive gain control.

* * * * *